United States Patent [19]
Klersy et al.

[11] Patent Number: 5,933,365
[45] Date of Patent: Aug. 3, 1999

[54] MEMORY ELEMENT WITH ENERGY CONTROL MECHANISM

[75] Inventors: Patrick Klersy, Lake Orion; Boil Pashmakov, Troy; Wolodymyr Czubatyj, Warren; Sergey Kostylev; Stanford R. Ovshinsky, both of Bloomfield Hills, all of Mich.

[73] Assignee: Energy Conversion Devices, Inc., Troy, Mich.

[21] Appl. No.: 08/878,870

[22] Filed: Jun. 19, 1997

[51] Int. Cl.⁶ .............................. G11C 11/00; H01L 45/00
[52] U.S. Cl. ................ 365/148; 365/163; 257/2; 257/5
[58] Field of Search ...................... 365/100, 113, 365/148, 163; 257/2, 3, 4, 5

[56] References Cited

U.S. PATENT DOCUMENTS

| | | | |
|---|---|---|---|
| 4,177,475 | 12/1979 | Holmberg | 365/163 |
| 4,795,657 | 1/1989 | Formigoni et al. | 365/100 |
| 5,363,329 | 11/1994 | Troyan | 365/148 |

*Primary Examiner*—Son Mai
*Attorney, Agent, or Firm*—Philip H. Schlazer; David W. Schumaker; Marvin S. Siskind

[57] ABSTRACT

An electrically operated, directly overwritable memory element comprising a volume of memory material having at least two electrical resistance values. The volume of memory material can be set to one of the resistance values in response to a selected electrical input signal without the need to be set to a specific starting or erased resistance value. The memory element includes resistive layers for controlling the distribution of electrical energy within the memory material, heating layers for transferring heat energy into the memory material, and thermal insulation layers for reducing the loss of heat energy from the memory material.

65 Claims, 4 Drawing Sheets

MEMORY ELEMENT WITH ENERGY CONTROL MECHANISM

FIELD OF THE INVENTION

The present invention relates generally to programmable memory material and a memory cell incorporating the memory material. More specifically, the present invention relates to a thin-film memory cell having a means for controlling the thermal environment of the memory material contained therein.

BACKGROUND AND PRIOR ART

The Ovonic EEPROM is a novel, proprietary, high performance, non-volatile, thin-film electronic memory device. Its advantages include non-volatile storage of data, potential for high bit density and, consequently, low cost because of its small footprint and simple two-terminal device configuration, long reprogramming cycle life, low programming energies and high speed. The Ovonic EEPROM is capable of both analog and digital forms of information storage. Digital storage can be either binary (one bit per memory cell) or multi-state (multiple bits per cell). Only minor device modifications are necessary to switch between the two digital modes. For purposes of the instant invention, the terms "memory elements" and "control elements" will be employed synonymously.

EARLY ELECTRICAL PHASE CHANGE MEMORY

The general concept of utilizing electrically writable and erasable phase change materials (i.e., materials which can be electrically switched between generally amorphous and generally crystalline states) for electronic memory applications is well known in the art, as is disclosed, for example, in U.S. Pat. No. 3,271,591 to Ovshinsky, issued Sep. 6, 1966 and in U.S. Pat. No. 3,530,441 to Ovshinsky, issued Sep. 22, 1970, both of which are assigned to the same assignee as the present invention, and both disclosures of which are incorporated herein by reference (hereinafter the "Ovshinsky patents").

As disclosed in the Ovshinsky patents, such phase change materials can be electrically switched between structural states of generally amorphous and generally crystalline local order or between different detectable states of local order across the entire spectrum between completely amorphous and completely crystalline states. That is, the Ovshinsky patents describe that the electrical switching of such materials is not required to take place between completely amorphous and completely crystalline states but rather can be in incremental steps reflecting changes of local order to provide a "gray scale" represented by a multiplicity of conditions of local order spanning the spectrum between the completely amorphous and the completely crystalline states. The early materials described by the Ovshinsky patents could also, if required, be switched between just the two structural states of generally amorphous and generally crystalline local order to accommodate the storage and retrieval of single bits of encoded binary information.

The electrically erasable phase change memories described in the Ovshinsky patents, as well as subsequent electrical solid state memory, had a number of limitations that prevented their widespread use as a direct and universal replacement for present computer memory applications, such as tape, floppy disks, magnetic or optical hard disk drives, solid state disk flash, DRAM, SRAM, and socket flash memory. Specifically, the following represent the most significant of these limitations: (i) a relatively slow (by present standards) electrical switching speed, particularly when switched in the direction of greater local order (in the direction of increasing crystallization); (ii) a relatively high input energy requirement necessary to initiate a detectable change in local order; and (iii) a relatively high cost per megabyte of stored information (particularly in comparison to present hard disk drive media).

The most significant of these limitations is the relatively high energy input required to obtain detectable changes in the chemical and/or electronic bonding configurations of the chalcogenide material in order to initiate a detectable change in local order. Also significant were the switching times of the electrical memory materials described in the Ovshinsky patents. These materials typically required times in the range of a few milliseconds for the set time (the time required to switch the material from the amorphous to the crystalline state); and approximately a microsecond for the reset time (the time required to switch the material from the crystalline back to the amorphous state). The electrical energy required to switch these materials typically measured in the range of about a microjoule.

It should be noted that this amount of energy must be delivered to each of the memory elements in the solid state matrix of rows and columns of memory cells. Such high energy levels translate into high current carrying requirements for the address lines and for the cell isolation/address device associated with each discrete memory element. Taking into consideration these energy requirements, the choices of memory cell isolation elements for one skilled in the art would be limited to very large single crystal diode or transistor isolation devices, which would make the use of micron scale lithography impossible and hence preclude a high packing density of memory elements impossible. Thus, the low bit densities of matrix arrays made from this material would result in a high cost per megabyte of stored information.

By effectively narrowing the distinction in price and performance between archival, non-volatile mass memory and fast, volatile system memory, the memory elements of the present invention have the capability of allowing for the creation of a novel, non-hierarchal "universal memory system". Essentially all of the memory in the system can be low cost, archival and fast. As compared to original Ovshinsky-type phase change electrical memories, the memory materials described herein provide over six orders of magnitude faster programming time (less than 30 nanoseconds) and use extremely low programming energy (less than 0.1 to 2 nanojoules) with demonstrated long term stability and cyclability (in excess of 10 trillion cycles). Also, experimental results indicate that additional reductions in element size can increase switching speeds and cycle life.

In general, development and optimization of the class of chalcogenide memory materials has not proceeded at the same rate as other types of solid state electrical memories that now have substantially faster switching times and substantially lower set and reset energies. These other forms of memories typically employ one or two solid state micro-electronic circuit elements for each memory bit (as many as three or four transistors per bit) in some memory applications. The primary "non-volatile" memory elements in such solid state memories, such as EEPROM, are typically floating gate field effect transistor devices which have limited re-programmability and which hold a charge on the gate of a field effect transistor to store each memory bit. Since this charge can leak off with the passage of time, the storage of information is not truly non-volatile as it is in the phase change media of the prior art where information is stored through changes in the actual atomic configuration or electronic structure of the chalcogenide material from which the elements are fabricated. These other forms of memories now enjoy acceptance in the marketplace.

In contrast to DRAM, SRAM, EPROM, EEPROM, and "flash" memory devices such as floating gate structures, no field effect transistor devices are required in the electrical memory devices of the present invention. In fact, the electrically erasable, directly overwritable memory elements of the present invention represent the simplest electrical memory device to fabricate, comprising only two electrical contacts to a monolithic body of thin film chalcogenide material and a semiconductor diode for isolation. As a result, very little chip "real estate" is required to store a bit of information, thereby providing for inherently high density memory chips. Furthermore, additional increases in information density can be accomplished through the use of multibit storage in each discrete memory cell.

In order to address the flash EEPROM market and be considered as a universal memory, memory elements must be truly non-volatile. This is even more significant if the memory element is claimed to possess multibit storage capabilities. If a set resistance value is lost or even found to significantly drift over time, the information stored therein is destroyed, users lose confidence in the archival capabilities of the memory.

In addition to set resistance stability, another highly important factor which would be required of a universal memory is low switching current. This is extremely significant when the EEPROMs are used for large scale archival storage. Used in this manner, the EEPROMs would replace the mechanical hard drives (such as magnetic or optical hard drives) of present computer systems. One of the main reasons for this replacement of conventional mechanical hard drives with EEPROM "hard drives" would be to reduce the comparatively large power consumption of the mechanical systems. In the case of lap-top computers, this is of particular interest because the mechanical hard disk drive is one of the largest power consumers therein. Therefore, it would be especially advantageous to reduce this power load, thereby substantially increasing the operating time of the computer per charge of the power cells. However, if the EEPROM replacement for mechanical hard drives has high switching energy requirements (and therefore high power requirements), the power savings may be inconsequential or at best unsubstantial. Therefore, any EEPROM which is to be considered a universal memory requires low switching energy.

Yet another requirement of a EEPROM universal memory is high thermal stability of the information stored therein. Today's computers, especially personal computers, are routinely subjected to high temperatures. These high temperatures can be caused by internally created heat such as from power sources or other heat producing internal components. These high temperatures may also be caused by environmental factors, such as use of the computer in a hot climate or storage of the computer in an environment which is directly or indirectly heated to higher than normal temperatures. Whatever the cause of the elevated temperatures, present computer memory arrays, especially "hard" or archival memory, must be thermally stable even at relatively high temperatures. Without this thermal stability data loss may occur leading to the aforementioned loss of credibility.

Still another requirement of a EEPROM universal memory is long write/erase cycle life. For EEPROMs, as is the case with all archival memory, cycle life plays an important role in consumer confidence and acceptance. If the cycle life of a memory device is too short, the consumer will be adverse to using this device for fear of losing valuable data. If the EEPROM is to be used as a replacement for computers main memory or display memory, that is, as a replacement for DRAM, SRAM or VRAM, the requirement of long cycle life is even more critical. The main and display memory are a computer's most often written to/erased data storage area. Every time a new computer program is loaded, a portion of the computer's main memory is erased and rewritten. During the execution of a computer program, a portion of the computer's main memory is constantly being cycled. Every time information on the computer monitor's display is changed, portions of the display memory are cycled. If the EEPROMs used to replace the computer's main and display memory do not have a relatively long write/erase cycle life, these memories would need to be replaced excessively.

SUMMARY OF THE INVENTION

An object of the present invention is to provide a solid state memory element having reduced programming current requirements. It is also an object of the present invention to provide a means of controlling the distribution of electrical and heat energy within at least a portion of the volume of memory material of the memory element. It is further an object of the present invention to provide a means of controlling the transfer of heat energy into and out of at least a portion of the volume of memory material.

These and other objects are satisfied by an electrically operated, directly overwritable memory element comprising: a volume of memory material having two or more electrical resistance values, the memory material being setable to one of the electrical resistance values in response to a selected electrical input signal without the need to be set to a specific starting or erased electrical resistance value; a pair of spacedly disposed electrical contacts for supplying the electrical input signal; and energy control means for controlling the energy environment of at least a portion of the volume of memory material. The energy control means may include thermal control means for controlling the thermal environment of at least a portion of the volume of memory material. The energy control means may include electrical control means for controlling the distribution of current within at least a portion of the volume of memory material.

These and other objects are also satisfied by an electrically operated memory array comprising: a plurality of electrically activated, directly overwritable memory elements, each of the plurality of memory elements including: a volume of memory material having two or more electrical resistance values. The volume of memory material can be set to one of the electrical resistance values in response to a selected electrical input signal without the need to be set to a specific starting or erased electrical resistance value; a pair of spacedly disposed electrical contacts for supplying the electrical input signal; and energy control means for controlling the energy environment of at least a portion of the volume of memory material. The energy control may include thermal control means for controlling the thermal environment of at least a portion of the volume of memory material. The thermal control means may include thermal isolating means for thermally isolating each of the plurality of memory elements from all other of the plurality of memory elements.

Each of the plurality of memory elements may further include an electrical isolation device electrically isolating each of the plurality of memory elements from all other of the plurality of memory elements.

These and other objects of the invention are also satisfied by a method of programming an electrically operated memory element, the method comprising: providing a memory element, the memory element including: a volume of memory material two or more electrical resistance values, the volume of memory material being setable to one of said electrical resistance values in response to a selected electrical input signal; and a pair of spacedly disposed electrical contacts for supplying the electrical input signal; applying an electrical input signal to the contacts; and controlling the electrical input signal and the energy environment of the volume of memory material such that the viscosity of the material is reduced to below about $10^{14}$ Poise.

DETAILED DESCRIPTION OF THE INVENTION

Erasable electrical memories fabricated from the broad class of chalcogenide materials have employed structural changes that were accommodated by large scale movement of certain atomic species within the material to permit change of phase as the material switched from the amorphous state to the crystalline state. For example, in the case of electrically programmable chalcogenide alloys formed of tellurium and germanium, such as those comprising about 80% to 85% tellurium and about 15% germanium along with certain other elements in small quantities of about one to two percent each, such as sulfur and arsenic, the more ordered or crystalline state was typically characterized by the formation of a highly electrically conductive crystalline Te filament within the programmable pore of the memory material. A typical composition of such a prior art material would be, for example, $Te_{81}Ge_{15}S_2As_2$ or $Te_{81}Ge_{15}S_2Sb_2$. Because Te is so highly conductive in its crystalline state, a very low resistance condition was established through the Te filament in the more ordered or crystalline state; this resistance being a number of orders of magnitude lower than the resistance of the pore in the less ordered or amorphous state.

However, the formation of the crystalline Te filament required large scale migration of the Te atoms from their atomic configuration in the amorphous state to the new locally concentrated atomic configuration in the Te crystalline filament state. Similarly, when the chalcogenide filamentary material was programmed back to the amorphous state, the Te which had precipitated out into the crystalline filament was required to migrate within the material from its locally concentrated form in the filament back to its atomic configuration in the amorphous state. This atomic migration, diffusion or rearrangement between the amorphous and crystalline states required in each case a relatively long holding or dwell time sufficient to accommodate the migration, thereby making the requisite programming time and energy relatively high.

The present invention discloses a class of chalcogenide semiconductor materials requiring reduced energy input. These chalcogenide materials provide for programming within a range of stable states with low energy inputs at fast speeds.

Specifically, the electrically operated, directly overwritable memory element of the present invention comprises a volume of memory material having at least two electrical resistance values. The memory material can be set to one of the electrical resistance values in response to a selected electrical input signal without the need to be set to a specific starting or erased resistance value. The resistance values of the memory material are electrically detectable.

The memory material is non-volatile and will maintain the integrity of the information stored by the memory cell (within a selected margin of error) without the need for periodic refresh signals.

The memory material may be formed from a plurality of constituent atomic elements, each of which is present throughout the entire volume of memory material. Preferably, the memory material includes one or more elements selected from the group consisting of Te, Se, Ge, Sb, Bi, Pb, Sn, As, S, Si, P, O and mixtures or alloys thereof. More preferably, the memory material includes one or more chalcogen elements. The memory material may further include one or more transition metal elements. The term "transition metal" as used herein includes elements 21 to 30, 39 to 48, 57 and 72 to 80.

Preferably, the one or more chalcogen elements are selected from the group consisting of Te, Se, and mixtures or alloys thereof. More preferably, the one or more chalcogen elements includes a mixture of Te and Se.

Preferably, the one or more transition metal elements are selected from the group consisting of Cr, Fe, Ni, Nb, Pd, Pt and mixtures or alloys thereof. More preferably the transition metal includes Ni. Specific examples of such multi-element systems are set forth hereinafter with respect to the Te:Ge:Sb system with or without Ni and/or Se.

The specific semiconductor alloys employed in fabricating the memory devices include chalcogenide elements which are characterized by the presence of "lone pair" valence electrons. It is therefore necessary to discuss the effect of those lone pair electrons in available chemical bonding configurations. A lone pair is a pair of electrons in the valence shell of an atom that is typically not engaged in bonding. Such lone pair electrons are important both structurally and chemically. They influence the shape of molecules and crystalline lattice structures by exerting strong repulsive forces on neighboring electron pairs which are engaged in bonding configurations and as well as on other lone pairs. Since lone pair electrons are not tied down into a bonding region by a second nucleus, they are able to influence and contribute to low energy electronic transitions.

As first pointed out by Ovshinsky, the lone pairs can have 1 and 3 center bonding; and as demonstrated by Kastner, Adler and Fritsche, they can give rise to the formation of valance alternation pairs.

Specifically, the tellurium alloys described herein have a valence band made up of lone pair states. Since four (4) p shell electrons are present in Te, and the Te atom is chemically bonded by two of these bonding electrons in the p shell, the other two outer electrons (the lone pair) are not utilized for bonding purposes and hence do not substantially change the atomic energy of the system. In this regard, note that the highest filled molecular orbital is the orbital which contains the lone pair electrons. This is significant because, in a perfect stoichiometric crystal of tellurium and germanium atoms, upon the application of some internal strain in the lattice from which the crystallite is formed, the valence band can broaden and move upward toward the position of the then existing Fermi level. However, TeGe crystals are naturally "self-compensated", that is, the crystal desires to preferentially assume a Te rich (approximately 52 percent Te and 48 percent Ge) composition. The stoichiometric crystal is a face centered cube; however, with the addition of a minimal amount of energy, the crystal can assume a rhombohedral lattice structure by increasing the number of its Ge and/or Sb vacancies. It is this creation of vacancies in the crystalline lattice structure, which can reduce lattice strain in TeGe alloys, is responsible for lowering the energy state of the material and moves the Fermi level toward the valence band.

It is acceptable, if not essential to superimpose an amorphous model of local order on top of a short range local order model for the purpose of obtaining a descriptive, if not perfectly predictive explanation of atomic behavior. When considering the amorphous nature of the material, note that the density of defect states in the band tails is greatest adjacent the band edges, while the depth of the recombination centers for captured charge carriers are deeper farther away from the band edges. The presence of these deep traps and tail states would provide a possible explanation for intermediate stable resistance values between the Fermi level position and the band edge.

It is further believed that the size of the crystallites which exist in the bulk of the semiconductor and memory material is relatively small, preferably less than about 2000 Å, more preferably between about 50 Å and 500 Å, and most preferably on the order of about 200 Å to about 400 Å. Further, these crystallites are believed to be surrounded by an amorphous skin which may contribute to the rapid formation of the many Fermi level positions of the material, detectable as different resistances (conductivities), as well as to the lower energy requirements for the transitions between these detectable resistance values to which the material can be reliably and repeatably set.

It has also been found that modulation of the programming characteristics of two or three terminal semiconductor devices fabricated from the microcrystalline materials of the present invention may be controlled such that repeatable and detectable resistance values can be effected. It has been found that, in order for the materials of the present invention to be quickly set by low energy input signals to a desired conductivity (determined by the Fermi level position), it is only necessary that said materials are capable of stable (or long lived metastable) existence within at least two different Fermi level positions, which Fermi level positions are characterized by substantially constant band gaps but different electrical conductivities. As noted above, it is also believed that the relatively small crystallite size may contribute to the rapid transition between detectable values of resistance.

One characteristic of the semiconductor materials of the present invention is their tendency toward the formation of more and smaller crystallites per unit volume. Crystallite sizes of the widest preferential range of representative materials embodying the present invention have been found to be far less than about 2000 Å, and generally less than the range of about 2,000 Å to 5,000 Å which was characteristic of prior art materials. Crystallite size is defined herein as the diameter of the crystallites, or of their "characteristic dimension" which is equivalent to the diameter where the crystallites are not spherically shaped.

It has been determined that compositions in the highly resistive state of the class of TeGeSb materials which meet the criteria of the present invention are generally characterized by substantially reduced concentrations of Te relative to that present in prior art electrically erasable memory materials. In one composition that provides substantially improved electrical switching performance characteristics, the average concentration of Te in the as deposited materials was well below 70%, typically below about 60% and ranged in general from as low as about 23% up to about 58% Te and most preferably about 40% to 58% Te. Concentrations of Ge were above about 5% and ranged from a low of about 8% to about 30% average in the material, remaining generally below 50%. The remainder of the principal constituent elements in this composition was Sb. The percentages given are atomic percentages which total 100% of the atoms of the constituent elements. Thus, this composition may be characterized as $Te_a Ge_b Sb_{100-(a+b)}$. These ternary Te—Ge—Sb alloys are useful starting materials for the development of additional memory materials having even better electrical characteristics.

Melts were prepared from various mixtures of Te, Ge and Sb, the melts segregated into multiple phases upon rapid solidification. Analysis of these rapidly solidified melts indicated the presence of ten different phases (not all present in any one rapidly solidified melt). These phases are: elemental Ge, Te and Sb, the binary compounds GeTe, and $Sb_2 Te_3$ and five different ternary phases. The elemental compositions of all of the ternary phases lie on the pseudo-binary GeTe—$Sb_2 Te_3$ line.

The novel memory elements of the present invention include a volume of memory material, said memory material preferably including at least one chalcogen and can include one or more transition metals. The memory materials which include transition metals are elementally modified forms of our memory materials in the Te—Ge—Sb ternary system. That is, the elementally modified memory materials constitute modified forms of the Te—Ge—Sb memory alloys. This elemental modification is achieved by the incorporation of transition metals into the basic Te—Ge—Sb ternary system, with or without an additional chalcogen element, such as Se. Generally the elementally modified memory materials fall into two categories.

The first category is a phase-change memory material which includes Te, Ge, Sb and a transition metal, in the ratio $(Te_a Ge_b Sb_{100-(a+b)})_c TM_{100-c}$ where the subscripts are in atomic percentages which total 100% of the constituent elements, wherein TM is one or more transition metals, a and b are as set forth herein above for the basic Te—Ge—Sb ternary system and c is between about 90% and about 99.99%. The transition metal preferably include Cr, Fe, Ni, Nb, Pd, Pt and mixtures or alloys thereof.

Specific examples of phase-change memory materials encompassed by this system would include $(Te_{56}Ge_{22}Sb_{22})_{95}Ni_5$, $(Te_{56}Ge_{22}Sb_{22})_{90}Ni_{10}$, $(Te_{56}Ge_{22}Sb_{22})_{95}Cr_5$, $(Te_{56}Ge_{22}Sb_{22})_{90}Cr_{10}$, $(Te_{56}Ge_{22}Sb_{22})_{95}Fe_5$, $(Te_{56}Ge_{22}Sb_{22})_{95}Fe_{10}$, $(Te_{56}Ge_{22}Sb_{22})_{95}Pd_5$, $(Te_{56}Ge_{22}Sb_{22})_{90}Pd_{10}$, $(Te_{56}Ge_{22}Sb_{22})_{95}Pt_5$, $(Te_{56}Ge_{22}Sb_{22})_{95}Pt_{10}$, $(Te_{56}Ge_{22}Sb_{22})_{95}Nb_5$, $(Te_{56}Ge_{22}Sb_{22})_{90}Nb_{10}$, $(Te_{56}Ge_{22}Sb_{22})_{90}Ni_5Cr_5$, $(Te_{56}Ge_{22}Sb_{22})_{90}Ni_5Fe_5$, $(Te_{56}Ge_{22}Sb_{22})_{90}Cr_5Fe_5$, $(Te_{56}Ge_{22}Sb_{22})_{90}Pd_5Cr_5$, $(Te_{56}Ge_{22}Sb_{22})_{90}Ni_5Pd_5$, $(Te_{56}Ge_{22}Sb_{22})_{90}Pd_5Pt_5$, etc.

The second category is a phase-change memory material which includes Te, Ge, Sb, Se and a transition metal, in the ratio $(Te_aGe_bSb_{100-(a+b)})_cTM_dSe_{100-(c+d)}$ where the subscripts are in atomic percentages which total 100% of the constituent elements, TM is one or more transition elements, and a and b are as set forth hereinabove for the basic Te—Ge—Sb ternary system, c is between about 90% and 99.5% and d is between about 0.01% and 10%. The transition metal can preferably include Cr, Fe, Ni, Pd, Pt, Nb and mixtures or alloys thereof. Specific examples of memory materials encompassed by this system would include $(Te_{56}Ge_{22}Sb_{22})_{90}Ni_5Se_5$, $(Te_{56}Ge_{22}Sb_{22})_{80}Ni_{10}Se_{10}$, $(Te_{56}Ge_{22}Sb_{22})_{90}Cr_5Se_5$, $(Te_{56}Ge_{22}Sb_{22})_{80}Cr_{Se10}$, $(Te_{56}Ge_{22}Sb_{22})_{90}Fe_5Se_5$, $(Te_{56}Ge_{22}Sb_{22})_{80}Fe_{10}Se_{10}$, $(Te_{56}Ge_{22}Sb_{22})_{90}Pd_5Se_5$, $(Te_{56}Ge_{22}Sb_{22})_{80}Pd_{10}Se_{10}$, $(Te_{56}Ge_{22}Sb_{22})_{90}Pt_5Se_5$, $(Te_{56}Ge_{22}Sb_{22})_{80}Pt_{10}Se_{10}$, $(Te_{56}Ge_{22}Sb_{22})_{90}Nb_5Se_5$, $(Te_{56}Ge_{22}Sb_{22})_{80}Nb_{10}Se_{10}$, $(Te_{56}Ge_{22}Sb_{22})_{85}Ni_5Cr_5Se_5$, $(Te_{56}Ge_{22}Sb_{22})_{80}Ni_5Fe_5Se_{10}$, $(Te_{56}Ge_{22}Sb_{22})_{85}Cr_5Fe_5Se_5$, $(Te_{56}Ge_{22}Sb_{22})_{85}Ni_5Pd_5Se_5$, $(Te_{56}Ge_{22}Sb_{22})_{80}Ni_5Pt_5Se_{10}$, $(Te_{56}Ge_{22}Sb_{22})_{85}Ni_5Nb_5Se_5$, $(Te_{56}Ge_{22}Sb_{22})_{85}Pd_5Cr_5Se_5$, $(Te_{56}Ge_{22}Sb_{22})_{80}Pd_5Pt_5Se_{10}$, $(Te_{56}Ge_{22}Sb_{22})_{85}Pd_5Nb_5Se_5$, $(Te_{56}Ge_{22}Sb_{22})_{85}Pt_5Nb_5Se_5$, etc.

The memory elements of the instant patent application possess substantially non-volatile set resistance values. However, if the resistance value of the instant memory elements does, under some circumstances, drift from its original set value, "compositional modification", described hereinafter, may be used to eliminate for this drift. As used herein, the term "non-volatile" will refer to the condition in which the set resistance value remains substantially constant for archival time periods. Of course, software (including the feedback system discussed hereinafter) can be employed to insure that absolutely no "drift" occurs outside of a selected margin of error. Because drift of the resistance value of the memory elements can, if left unimpeded, hinder gray scale storage of information, it is desirable to minimize drift.

"Compositional modification" is defined herein to include any means of compositionally modifying the volume of memory material to yield substantially stable values of resistance, including the addition of band gap widening elements to increase the inherent resistance of the material. One example of compositional modification is to include graded compositional inhomogeneities with respect to thickness. For instances, the volume of memory material may be graded from a first Te—Ge—Sb alloy to a second Te—Ge—Sb alloy of differing composition. The compositional grading may take any form which reduces set resistance value drift. For example, the compositional grading need not be limited to a first and second alloy of the same alloy system. Also, the grading can be accomplished with more than two alloys. The grading can be uniform and continuous or it can also be non-uniform or non-continuous. A specific example of compositional grading which results in reduced resistance value drift includes a uniform and continuous grading of $Ge_{14}Sb_{29}Te_{57}$ at one surface to $Ge_{22}Sb_{22}Te_{56}$ at the opposite surface.

Another manner of employing compositional modification to reduce resistance drift is by layering the volume of memory material. That is, the volume of memory material may be formed of a plurality of discrete, relatively thin layers of differing composition. For example, the volume of memory material may include one or more pairs of layers, each one of which is formed of a different Te—Ge—Sb alloy. Again, as was the case with graded compositions, any combination of layers which results in substantially reduced resistance value drift can be employed. The layers may be of similar thickness or they may be of differing thickness. Any number of layers may be used and multiple layers of the same alloy may be present in the volume of memory material, either contiguous or remote from one another. Also, layers of any number of differing alloy composition may be used. A specific example of compositional layering is a volume of memory material which includes alternating layer pairs of $Ge_{14}Sb_{29}Te_{57}$ and $Ge_{22}Sb_{22}Te_{56}$.

Yet another form of compositional inhomogeneity to reduce resistance drift is accomplished by combining compositional grading and compositional layering. More particularly, the aforementioned compositional grading may be combined with any of the above described compositional layering to form a stable volume of memory material. Exemplary volumes of memory material which employ this combination are: (1) a volume of memory material which includes a discrete layer of $Ge_{22}Sb_{22}Te_{56}$ followed by a graded composition of $Gel_4Sb_{29}Te_{57}$ and $Ge_{22}Sb_{22}Te_{56}$ and (2) a volume of memory material which includes a discrete layer of $Ge_{14}Sb_{29}Te_{57}$ and a graded composition of $Ge_{14}Sb_{29}Te_{57}$ and $Ge_{22}Sb_{22}Te_{56}$.

Figure 1A:
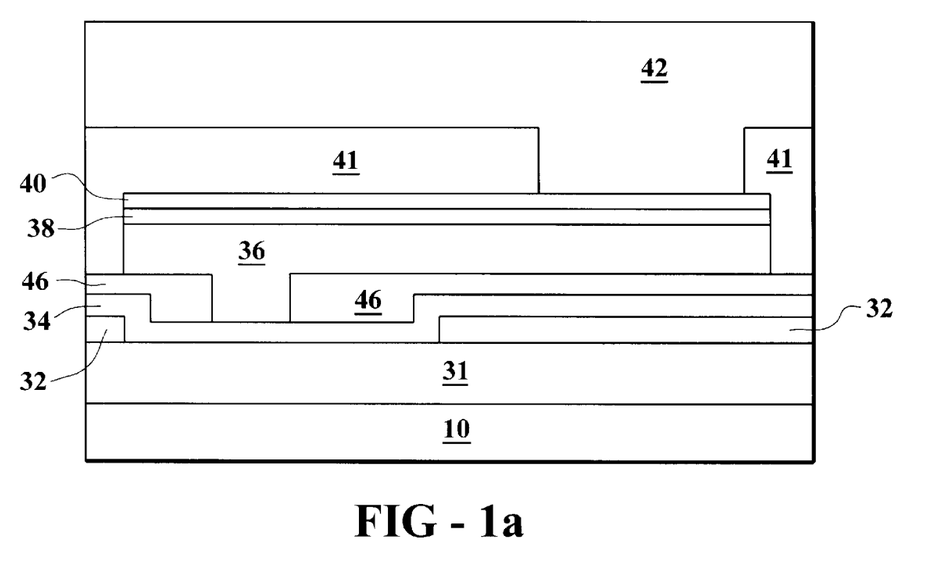
FIG. 1a is a stylized cross-sectional view of a single memory element specifically illustrating the heating layers and thermal insulation layers.

Referring to FIG. 1a, shown is a cross-sectional view of an embodiment of the memory element of the present invention formed on a single crystal silicon semiconductor wafer 10. The memory element 30 includes the memory material 36 which has been described above.

The memory element further includes a pair of spacedly disposed electrical contacts for supplying the electrical input signal to the memory material.

Preferably, at least one of the spacedly disposed electrical contacts is a thin-film electrical contact layer. In the embodiment shown in FIG. 1a, each of the electrical contacts is an electrical contact layer. The electrical contact layers are shown in FIG. 1a as thin-film layers 32 and 40.

Generally, each of the thin-film electrical contact layers are deposited sufficiently thin so that the thermal conducting properties of the layers will not dominate the thermal environment of the memory material. Preferably, at least one of the electrical contact layers is preferably deposited to a thickness between about 50 Å to about 2000 Å. More preferably, at least one of the electrical contact layers is deposited to a thickness between about 100 Å to about 1000 Å. Most preferably, at least one of the electrical contact layers is deposited to a thickness between about 150 Å to about 750 Å.

Generally, each of the electrical contact layers is formed from an electrically conductive material. Preferably, at least one of the electrical contact layers may be comprised of one or more elements from the group consisting of Ti, W, Mo, and mixtures or alloys thereof. More preferably, at least one of the electrical contact layers is comprised of Ti and W. Most preferably, at least one of the electrical contact layers are comprised of a compound, in atomic percent, of 5% to 30% titanium and 70% to 95% tungsten.

In the embodiment shown in FIG. 1a, each of the electrical contact layers 32 and 40 is a Ti—W layer that is preferably deposited using a DC sputtering deposition process. The Ti—W electrical contact layer 32 and 40 have excellent ohmic contact properties. Moreover, they have the barrier properties necessary to prevent both the electromigration and diffusion of foreign electrode material into the memory material.

In programming the memory devices of the instant invention, electrical energy is applied in a pulse of current. Exactly how electrical energy pulse brings about the change in atomic structure of the chacogenide memory material has been the subject of scientific investigation for many years, and several models have been proposed. Some have argued that the effect is a thermal one, while others have argued that the phenomenon is an electronic one. Experimental data have been put forward to demonstrate, under certain circumstances, both thermally induced and electrically induced structural changes in these materials. It is indeed likely that both thermal and electronic phenomena are involved in memory element programming.

Regardless of the mechanism, it is clear that a certain amount of energy needs to be introduced into the memory material to cause the programming event. The instant inventors have found that the essential requirement for the programming event is to input enough energy into the memory material to reduce its viscosity during the programming interval to below about $1 \times 10^{14}$ Poise. This reduced viscosity allows for the atomic rearrangement which results in memory programming.

The instant inventors have also found that when energy is lost to the surrounding environment, the programming event requires even more energy because of the loss. Hence, it can be seen that any energy lost to the environment reduces the energy available to lower the viscosity of the memory material.

In an effort to achieve a more efficient use of the energy available for programming the memory material the instant inventors have focused on an energy control means for controlling the "energy enviroment" of at least a portion of the memory material. More specifically, the energy control means is any device or mechanism that (1) controls the distribution of either electrical energy or heat energy within at least a portion of the volume of memory material, or (2) any device or mechanism that controls the transfer of heat energy either into or out of at least a portion of the volume of memory material.

At least a portion of the energy entering the volume of memory material is in the form of heat energy. Some of this heat energy is efficiently used in programming the material. The remainder is "wasted" by being lost to the surrounding environment. Hence, in an effort to achieve a more efficient use of the heat energy that is input into the memory material, the instant inventors have focused on ways of controlling the thermal environment of the material. This includes, but not limited to, ways of increasing the amount of heat energy entering at least a portion of the volume of memory material, ways of reducing the amount of heat loss from at least a portion of the volume of memory material, and ways of controlling the distribution of heat energy within at least a portion of the volume of memory material.

The energy control means includes a thermal control means for controlling the thermal environment of at least a portion of the volume of memory material. The thermal control means may be any device or mechanism that controls the transfer of heat energy into at least a portion of the volume of memory material, controls the transfer of heat energy out of at least a portion of the volume of memory material, or controls the distribution of heat energy within at least a portion of the volume of memory material.

The thermal control means includes heating means for transferring heat energy into at least a portion of the volume of memory material. The heating means may be implemented by one or more heating layers. The heating layers are preferably thin-film structures. Preferably, at least one of the heating layers is deposited adjacent to the volume of memory material. In the embodiment of the memory element shown in FIG. 1a, the heating means includes two heating layers deposited adjacent to the volume of memory material—a first heating layer 34 deposited adjacent to and below the memory material 36, and a second heating layer 38 deposited adjacent to and above the memory material 36. In the embodiment shown, the heating layers 34, 38 also provide electrical connectivity between the electrical contact layers 32, 40 and the memory material 36.

As electric charge moves through the heating layers 34 and 38, the electric potential energy of the charge is transferred as heat energy to the heating layer material. On a microscopic scale this can be understood as collisions between electrons and the material lattice which increases the amplitude of the thermal vibrations of the lattice. This effect is called Joule heating. The rate of transfer of electrical energy to heat energy is directly proportional to the electrical resistivity of the material. Increasing the electrical resistivity of the material increases the rate at which heat energy is formed from electrical energy.

Generally, the electrical resistivity of the heating layers is chosen to provide adequate Joule heating. Preferably, at least one of the heating layers has an electrical resistivity greater than about $1 \times 10^{-5}$ ohm-cm. More preferably, at least one of the heating layers has an electrical resistivity greater than about $1 \times 10^{-3}$ ohm-cm. Most preferably, at least one of the heating layers has an electrical resistivity greater than about $1 \times 10^{-1}$ ohm-cm.

The rate at which energy appears as Joule heat is also directly proportional to the square of the current density at a particular location of the material. At least a portion of the heat energy created within the heating layers as a result of Joule heating flows into at least a portion of the volume of the memory material, thereby heating the memory material.

The heating layers are positioned and sized to provide the optimum transfer of heat energy into the memory material. Preferably, at least one of the heating layers is deposited adjacent to the volume of memory material. In addition, the heating layers are preferably deposited sufficiently thin so that the thermal conducting properties of the layers do not dominate the thermal environment of the memory material. Preferably, at least one of the heating layers is deposited to a thickness between about 50 Å to about 2000 Å. More preferably, at least one of the heating layers is deposited to a thickness between about 100 Å to about 1000 Å. Most preferably, at least one of the heating layers is deposited to a thickness between about 150 Å to about 500 Å.

The relative positioning of the heating layers and the electrical contact layers also affects the transfer of heat energy into the memory material. In the embodiment shown in FIG. 1a, the electrical contact layer 32 and the heating layer 34 are laterally positioned to provide increased current density within the heating layer 34 proximate the region of contact between the memory material 36 and the heating layer 34, thereby increasing the heat transfer into at least a portion of the volume of memory material. The lateral positioning also increases the distance between the electrical contact layer 32 and the memory material 36, thereby reducing the effect of the electrical contact layer 32 on the thermal environment of the memory material (i.e., reducing the amount of heat energy channelled away from the memory material due to the thermal conductivity of the electrical contact layer material).

Other configurations for the heating layers are also possible. The memory element may include only a single heating layer deposited adjacent or remote to the memory material, and either above or below the memory material. As well, heating layers may be positioned laterally from at least a portion of the volume of memory material.

At least one of the heating layers may include one or more elements selected from the group consisting of Ti, V, Cr, Zr, Nb, M, Hf, Ta, W, and mixtures or alloys thereof, and two or more elements selected from the group consisting of B, C, N, O, Al, Si, P, S, and mixtures or alloys thereof. Preferably, at least one of the heating layers includes Ti, Al, and N. More preferably, at least one of the heating layers includes a compound having a composition of, in atomic percent, between about 10% to 60% titanium, 5% to 50% aluminum and 10% to 60% nitrogen. In the embodiment shown in FIG. 1a, each of the heating layers 34 and 38 may include titanium aluminum nitride.

In another embodiment, at least one of the heating layers may include titanium carbonitride. Preferably, at least one of the heating layers may include a compound having a composition of, in atomic percent, between about 10 to 60% titanium, 5 to 50% carbon and 10 to 60% nitrogen. In addition, the titanium carbonitride may also include up to 40% hydrogen.

In another embodiment, at least one of the heating layers may include titanium silicon nitride. Preferably, at least one of hte heating layers may include a compound having a composition of, in atomic percent, between about 10 to 60% titanium, 5 to 50% silicon and 10 to 60% nitrogen. The titanium aluminum nitride, titanium carbonitride, titanium siliconitride have excellent barrier properties, preventing both the diffusion and electromigration of foreign material into the chalcogenide memory material.

Alternately, in another embodiment, at least one of the heating layers may include amorphous carbon, amorphous silicon or a dual amorphous carbon/amorphous silicon structure.

The heating layers may be deposited by such methods as physical vapor deposition including evaporation, ion plating as well as DC and RF sputtering deposition, chemical vapor deposition, and plasma assisted chemical-vapor deposition. The exact method used depends upon many factors, one of which being deposition temperature constraints imposed by the composition of the chalcogenide target material.

The thermal control means may further include thermal insulation means for controlling the transfer of heat energy out of at least a portion of the memory material 36. The thermal insulation means may be embodied by one or more thermal insulation layers which partially encapsulate the memory material 36 and which reduce the transfer of heat energy from at least a portion of the volume of memory material. FIG. 1a shows an embodiment of the memory element 30 using two thermal insulation layers, a first thermal insulation layer 31 deposited remote to and below the memory material 36 and a second thermal insulation layer 41 deposited remote to and above the memory material 36. As shown in FIG. 1a, thermal insulation layer 41 has been appropriately etched to permit electrical contact between electrode 42 and electrical contact layer 40. In the embodiment shown in FIG. 1a, thermal insulation layer 41 has been etched so that electrode 42 is laterally displaced from the volume of memory material proximate the region of contact between thermal insulation layer 34 and memory material 36. Such lateral displacement further reduces the transfer of heat out of at least a portion of the volume of memory material by reducing the effect of the thermal conducting properties of layer 42.

Other configurations for the positioning of the thermal insulation layers are also possible. Generally, the thermal insulation layers may be deposited either adajacent or remote to the memory material. A single thermal insulation layer may be used (deposited either above or below the memory material, and either adjacent or remote to the memory material). As well, the thermal insulating material may be deposited to surround at least a portion of the lateral periphery of the memory material.

Generally, the thermal insulation layers at least partially encapsulate the memory material with a blanket of thermally insulating material. This blanket of insulation increases the amount of heat energy retained within at least a portion of the volume of memory material 36. It also decreases the rate of heat transfer from the memory material, thereby decreasing the rate of cooling of the memory material.

The thermal insulation layers are chosen to have good thermal insulating properties. The insulating properties of the thermal insulation layers depend upon the specific heat and thermal conductivity of the thermal insulation layer material. Decreasing the specific heat and/or the thermal conductivity of the material increases the insulating properties of layers thereby slowing the rate of heat loss from the volume of memory material. Hence, manipulation of these material properties may be used as a means of controlling and optimizing the cooling rate of the memory material.

Preferably, at least one of the thermal insulation layer has a thermal conductivity less than about 0.2 joule-cm per $cm^2$-Kelvin-sec. More preferably, at least one thermal insulation layer has a thermal conductivity less than about 0.01 joule-cm per $cm^2$-Kelvin-sec. Most preferably, at least thermal insulation layer has a thermal conductivity less than about 0.001 joule-cm per $cm^2$-Kelvin-sec.

Preferably, at least one thermal insulation layer has a specific heat capacity less than about 3 joule per $cm^3$-Kelvin. More preferably, at least one thermal insulation layer has a specific heat capacity less than about 1 joule per $cm^3$-Kelvin. Most preferably, at least one thermal insulation layer has a specific heat capacity less than about 0.1 joule per $cm^3$-Kelvin.

At least one thermal insulation layer may include one or more materials selected from the group consisting of oxides, nitrides, oxynitrides, carbonites, carbonitrides, fluorides, sulfides, chlorides, carbides, borides, phosphides, and mixtures or alloys thereof. Alternately, at least one thermal insulation layer may include an organic dielectric material.

Further examples of thermal insulation layer materials include spin-on glass and spin-on polymer. Still other examples of thermal insulation layer materials include silica and diamond.

The thickness of each of the thermal insulation layers affects the insulating properties of the layers (and hence the cooling rate of the memory material). Generally, increasing the thickness of the insulation layers increases the insulating properties, further slowing the cooling of the memory material. Preferably, at least one of the thermal insulation layers has a thickness between about 100 Å to about 10,000 Å. More preferably, at least one the thermal insulation layers has a thickness between about 500 Å to about 7500 Å. Most preferably, at least one of the thermal insulation layers has a thickness between about 1000 Å and about 5000 Å.

Figure 1B:
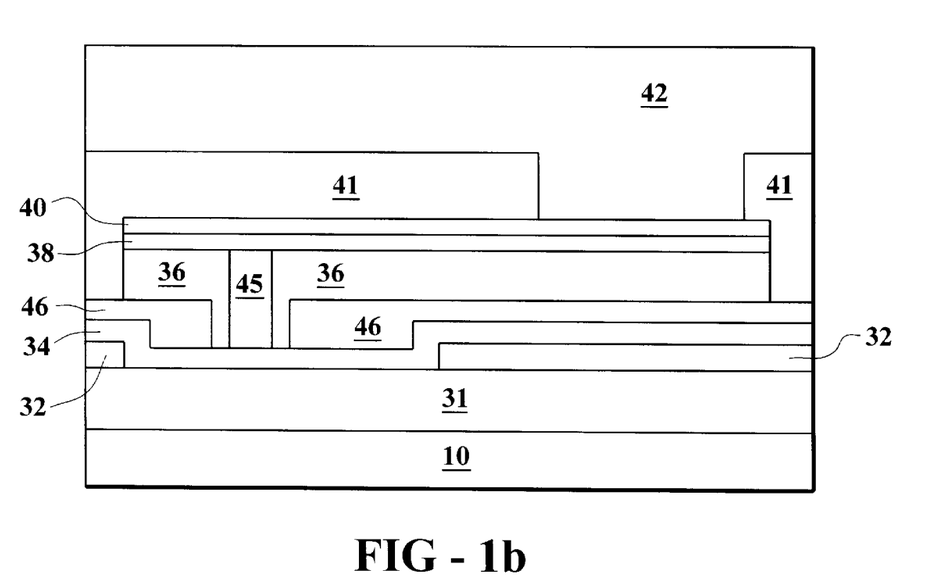
FIG. 1b is a stylized cross-section view of a single memory element specifically illustrating the thermal plug.

To provide additional control of the thermal environment of the volume of memory material, the thermal control means may include a volume of thermal insulating material that is at least partially encapsulated within the volume of memory material. This volume of thermal insulating material is referred to herein as a "thermal plug". The thermal plug provides a means of controlling the distribution of the heat energy within the volume of memory material. The thermal plug may be formed from the same materials selected for the thermal insulation layers described above. FIG. 1b shows an embodiment of a memory element using a thermal plug 45 encapsulated within the volume of memory material 36.

The layer of memory material 36 may be formed of a multi-element semiconductor material, such as the chalcogenide materials disclosed herein. The layer 36 may be deposited by methods such as sputtering, evaporation or by chemical vapor deposition (CVD), which may be enhanced by plasma techniques such as RF glow discharge. The chalcogenide memory materials of the instant invention are most preferably made by RF sputtering and evaporation.

The layer of memory material 36 is preferably deposited to a thickness of about 200 Å to 5,000 Å, more preferably of about 250 Å to 2,500 Å and most preferably of about 400 Å to 1,250 Å in thickness.

Generally, the term "pore diameter", as used herein, means the average cross-section of the smallest region of contact between the memory material 36, and memory element layers adjacent to the memory material 36. In the embodiment shown in FIG. 1a, the pore diameter is the average cross-section of the smallest region of contact between the memory material 36, and the heating layers 34, 38. The pore diameter of memory material 36 is less than about one to two micrometers or so, although there is no practical limit on the lateral dimension. It has been determined that the diameter of the actual conductive path of the high conductivity material is significantly less than a micrometer. The pore diameter can thus be as small as lithography resolution limits will permit and, in fact, the smaller the pore, the lower the energy requirements for programming.

It is preferred, that the pore diameter be selected such that it conforms substantially with the cross section of the memory material whose resistance is actually altered when the material is programmed to a different resistance. The pore diameter of the memory material 36 is therefore preferably less than about one micrometer so that the volume of the memory material 36 is limited, to the extent lithographically possible, to that volume of material 36 actually programmed.

We observe a trend in performance of the memory elements that is generally related to pore diameter. When the device is used in the binary mode, we see a general increase in the off-to-on resistance ratio as we test devices across a wafer in which pore diameters range systematically from just over one micron to not open at all. If the pore diameter is controlled within the range of, for example, from one micron to about one-sixth of a micron, there is an opportunity to improve the performance of our devices. Since factors such as current density and energy density are important in the programming of these devices, reduction in device volume, resulting from reduction in pore diameter, should result in an increase in sensitivity and speed. To minimize set energy/current/voltage, pore diameters of as small as 1500 Å, or even as small as 100 Å may be employed.

The energy control means discussed above, may include an electrical control means for controlling the distribution of electrical current within at least a portion of the volume of memory material. Specifically, the electrical control means may be implemented by one or more resistive layers. Preferably, at least one of the resistive layers is deposited adjacent to the volume of memory material. Each resistive layer is formed from material having sufficient electrical resistivity to spread the distribution current within at least a portion of the volume of memory material, thereby reducing electromigration within the material. Preferably, at least one resistive layer has a resistivity greater than about $1 \times 10^{-5}$ ohm-cm. More preferably, at least one resistive layer has a resistivity greater than about $1 \times 10^{-3}$ ohm-cm. Most preferably, at least one resistive layer has a resistivity greater than about $1 \times 10^{-1}$ ohm-cm.

Preferably, at least one resistive layer may include one or more elements selected from the group consisting of Ti, V, Cr, Zr, Nb, Mo, Hf, Ta, W and mixtures or alloys thereof; and two or more elements selected from the group consisting of B, C, N, O, Al, Si, P, S and mixtures or alloys thereof.

Materials from which at least one of the resistive layers may be formed include, but are not limited to, titanium aluminum nitride, titanium carbonitride, and titanium silicon nitride. Other materials include amorphous carbon, amorphous silicon or a dual amorphous carbon/amorphous silicon structure.

Preferably, at least one resistive layer is deposited to a thickness between about 50 Å to about 2000 Å. More preferably, at least one resistive layer has a thickness between about 100 Å to about 1000 Å. Most preferably, at least one resistive layers is has a thickness between about 150 Å to about 500 Å.

In the embodiment of the memory element shown in FIG. 1, the functionality of resistive layers is implemented by heating layers 34, 38 having the required electrical resistivity.

The memory element shown in FIG. 1a may be formed in a multi-step process. Layers 31, 32, 34 and 46 are first deposited and layer 46 is etched to form the pore. The layers 36, 38, 40, and the thermal insulation layer 41 are then deposited. The entire stack of layers is then etched to the selected dimensions. Deposited on top of the entire structure is electrical dielectric material 39 such as $SiO_2$ or $Si_3N_4$. The electrical dielectric material 39 and the thermal insulation layer 41 may then be selectively etched so that electrode 42 is appropriately positioned relative to the pore.

The electrode grid structure 42 extends perpendicular in direction to conductors 12 and completes the X-Y grid connection to the individual memory elements. Overlaying the complete integrated structure is a top encapsulating layer of a suitable encapsulant such as $Si_3N_4$ or a plastic material such as polyimide, which seals the structure against moisture and other external elements which could cause deterioration and degradation of performance. The $Si_3N_4$ encapsulant can be deposited, for example, using a low temperature plasma deposition process. The polyimide material can be spin deposited and baked after deposition in accordance with known techniques to form the encapsulant layer.

Figure 2A:
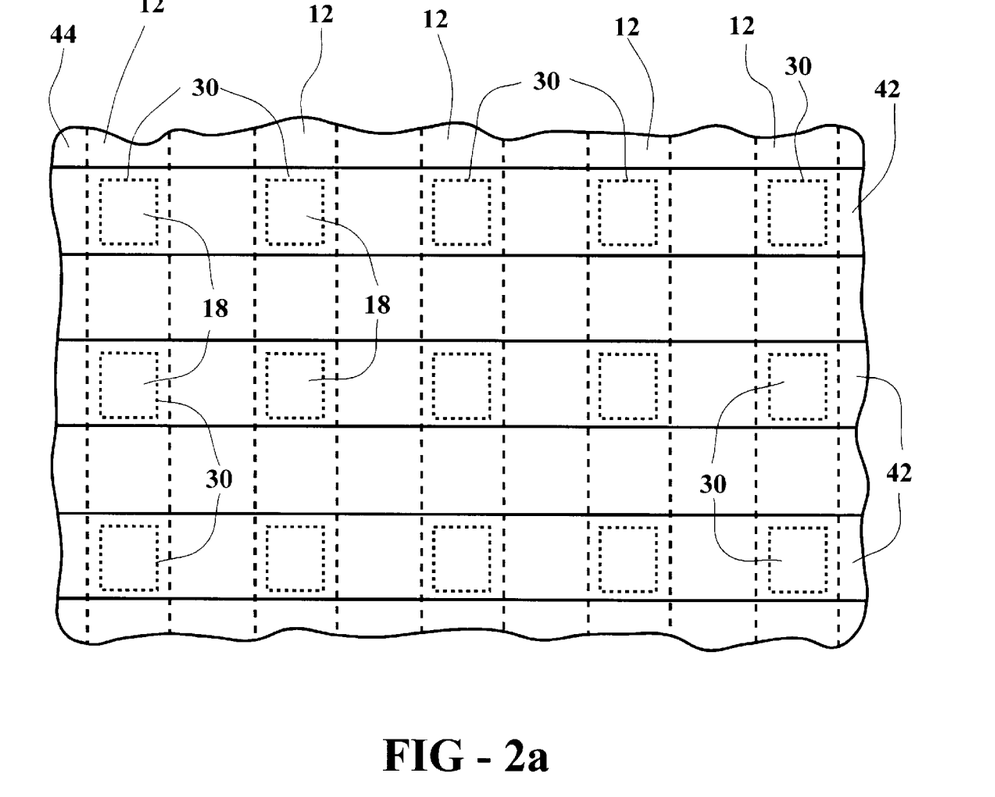
FIG. 2a is a stylized top view of an array of multiple memory elements showing how the elements would be connected to a set of X-Y addressing lines.

Also disclosed herein is an electrically operated memory array comprising a plurality of the memory elements described above. One embodiment of a memory array is a two-dimensional memory array of memory elements. The top view of this embodiment is shown in FIG. 2a. As shown, the devices form an X-Y matrix of memory elements. The memory array includes an X-Y electrode grid of addressing lines for selectively setting and reading the individual memory elements. The horizontal strips 12 represent the X set of an X-Y electrode grid and the vertical strips 42 represent the Y set of addressing lines.

Figure 3:
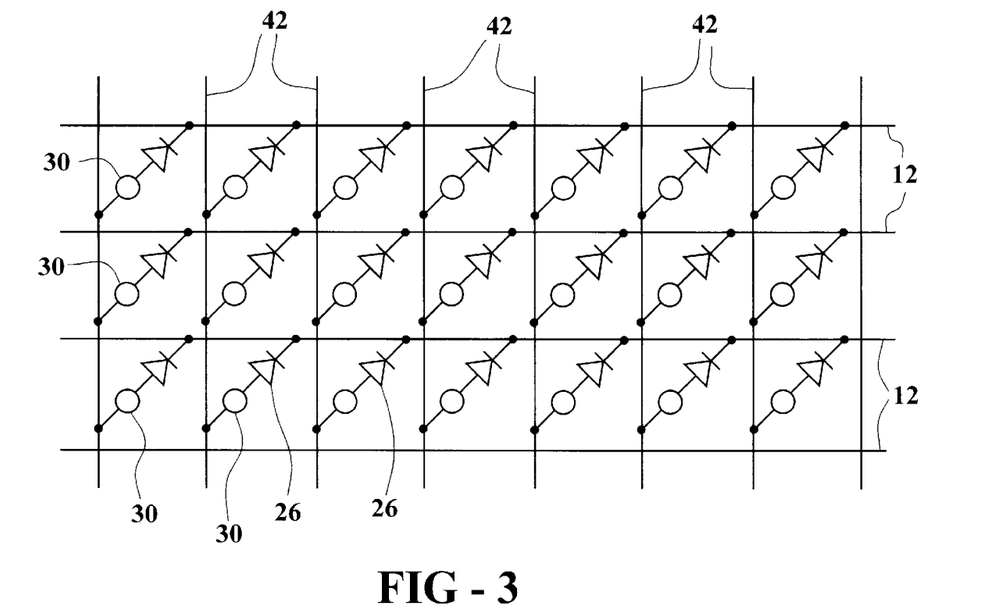
FIG. 3 is a schematic diagram of an array of memory elements additionally showing the manner in which isolation elements such as diodes are connected in series with the memory elements to electrically isolate each memory element from the others.

Associated with each memory element in the memory array is an electrical isolation device which electrically isolates each memory element from all other memory elements in the memory array. FIG. 3 shows a schematic diagram of the two-dimensional memory array from FIG. 2a. FIG. 3 shows how electrical isolation can be accomplished using diodes. The circuit comprises an X-Y grid with the memory elements 30 being electrically interconnected in series with isolation diodes 26. Address lines 12 and 42 are connected to external addressing circuitry in a manner well known to those skilled in the art. The purpose of the electrical isolation devices is to enable each discrete memory element to be read and written without interfering with information stored in any other memory element of the matrix.

Figure 2B:
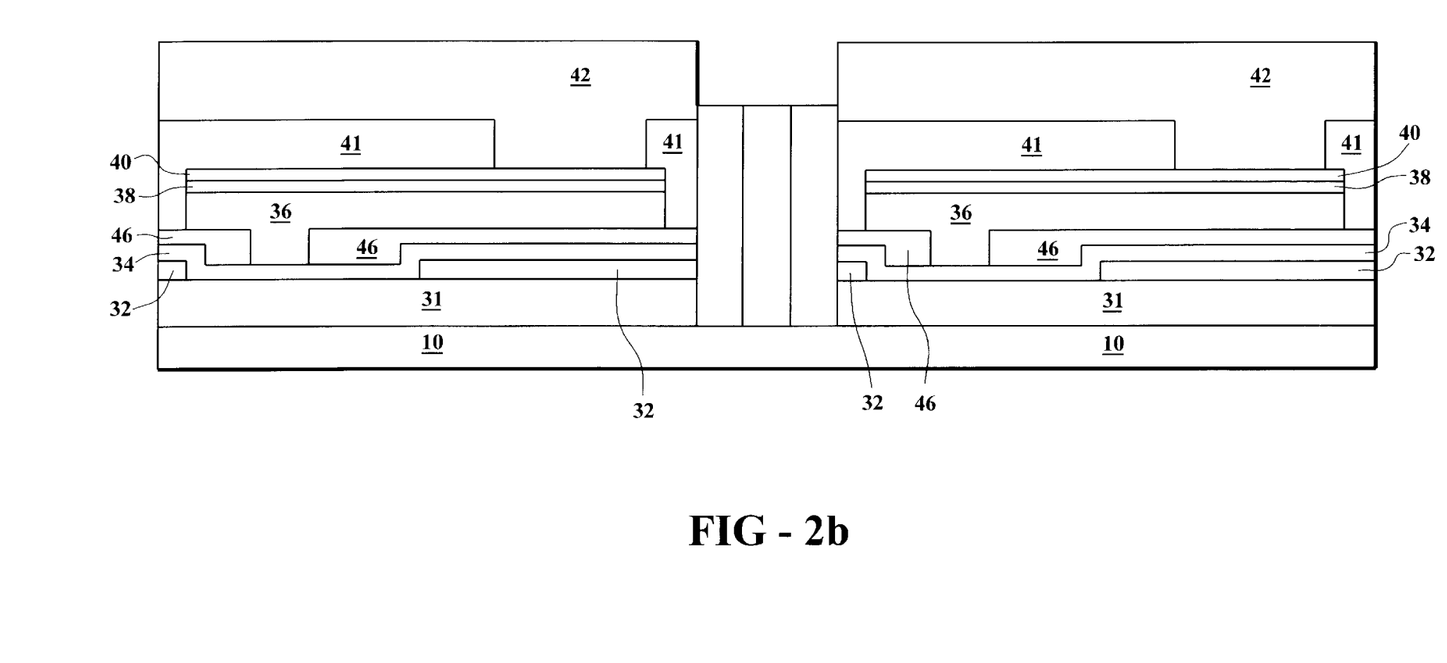
FIG. 2b is a stylized side view of an array of multiple memory elements including a thermal channel for thermally isolating one memory element from all other of the memory elements.

The memory array may further comprise thermal isolation means for thermally isolating each of the memory elements from all other of the memory elements. An embodiment of thermal isolation means is shown in FIG. 2b which depicts a thermal channel 60 comprising thermally conductive material which has been deposited between each of the individual memory elements. The thermal channel 60 may be made from a metal or any other material having sufficient thermal conductivity to channel heat from one of the memory elements away from all the other memory elements. Preferably, the thermal channel 60 includes material having a thermal conductivity greater than about 0.5 joule-cm per $cm^2$-Kelvin-sec. In the embodiment shown in FIG. 2b, the thermally conductive material is deposited to contact the substrate 10, thereby channelling heat to the substrate.

Other configurations for the memory array are possible. One configuration is a three-dimensional, multilevel array having a plurality of stacked planes of memory elements and their respective electrical isolation devices. Each plane of memory elements is arranged in rows and columns of memory elements, thereby allowing for X-Y addressing. This stacking of planes, in addition to increasing memory storage density, allows for an additional Z dimension of interconnection. This arrangement is particularly useful to simulate a neural network for a truly intelligent computer.

Figure 4:
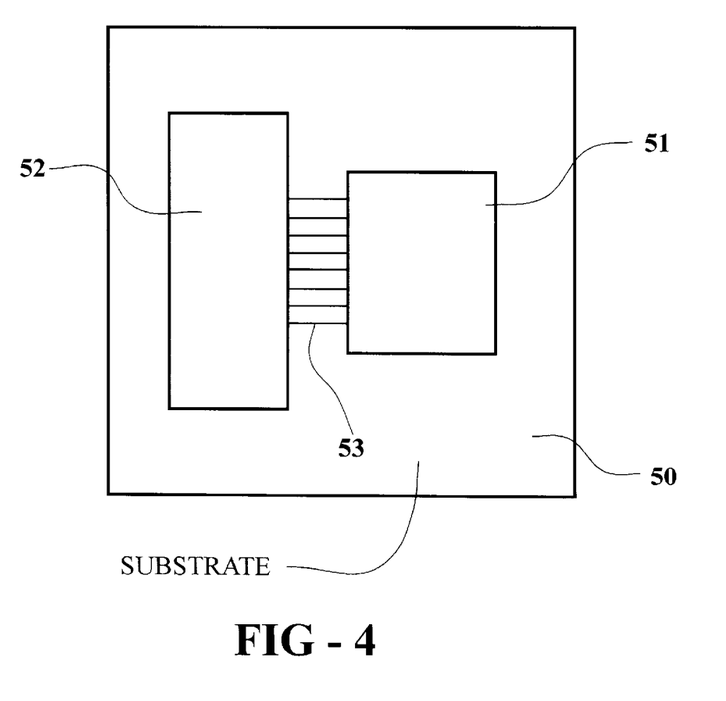
FIG. 4 is a schematic representation illustrating a single crystal semiconductor substrate with a memory matrix (i.e., array of memory elements) of the instant invention placed in electrical communication with an integrated circuit chip on which the address/drivers/decoders are operatively affixed.

FIG. 4 shows a portion of a single crystal semiconductor substrate 50 with a memory matrix 51 of the present invention formed thereon. Also formed on the same substrate 50 is an addressing matrix 52 which is suitably connected by integrated circuitry connections 53 to the memory matrix 51. The addressing matrix 52 includes signal generating means which define and control the setting and reading pulses applied to the memory matrix 51. Of course, the addressing matrix 52 may be integrated with and formed simultaneously with the solid state memory matrix 51.

Experimentation has shown that factors such as chalcogenide composition, thermal preparation (post deposition anneal), signal pulse duration, impurities such as oxygen present in the composition, crystallite size and signal pulse waveform shape have an effect on the magnitude of the dynamic range of resistances, the absolute end-point resistances of said dynamic range, and the voltages required to set the device at these resistances. For example, relatively thick chalcogenide films (i.e. about 4000 Å) will result in higher set voltage requirements (and therefore higher current densities within the volume of memory material), while relatively thin chalcogenide layers (i.e. about 250 Å) will result in lower set voltage (and current density) requirements. Of course, the possible significance of crystallite size and, therefore, the ratio of the number of surface atoms relative to the number of bulk atoms has previously been described.

The dynamic range of resistances also allows for broad gray scale and multilevel analog memory storage. Multilevel memory storage is accomplished by dividing the broad dynamic range into a plurality of sub-ranges or levels. The continuous resistance programmability allows for multiple bits of binary information to be stored in a single memory cell. This multilevel storage is accomplished by mimicking multiple bits of binary information in pseudo-analog form and storing this analog information in a single memory cell. Thus, by dividing the dynamic range of resistances into $2^n$ analog levels, each memory cell would be provided with the capability of storing n bits of binary information.

Through the use of the proprietary materials and device configurations disclosed herein, an electrically erasable, directly overwritable memory element has been developed which provides fast read and write speeds, approaching those of SRAM devices; non-volatility and random access reprogramming capabilities of an EEPROM; and a price per megabyte of storage significantly below any other semiconductor memory.

Also disclosed herein is a method of programming an electrically operated memory element, the method comprising the step of providing a memory element, the memory element including: a volume of memory material having two or more electrical resistance values, the volume of memory material being setable to one of the electrical resistance values in response to a selected electrical input signal; and a pair of spacedly disposed electrical contacts for supplying the electrical input signal.

The method further comprises the step of applying an electrical input signal to the contacts. The method further comprises the step of controlling the electrical input signal and the energy environment of the volume of memory material such that the viscosity of the material is reduced to below about $10^{14}$ Poise.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. An electrically operated, directly overwritable memory element comprising:
   a volume of memory material having two or more electrical resistance values, said volume of memory material being setable to one of said electrical resistance values in response to a selected electrical input signal without the need to be set to a specific starting or erased electrical resistance value;
   a pair of spacedly disposed electrical contacts for supplying said electrical input signal; and
   energy control means for controlling the energy environment of at least a portion of said volume of memory material.

2. The memory element of claim 1, wherein said energy control means includes thermal control means for controlling the thermal environment of at least a portion of said volume of memory material.

3. The memory element of claim 2, wherein said thermal control means includes heating means for transferring heat energy into at least a portion of said volume of memory material.

4. The memory element of claim 2, wherein said thermal control means includes thermal insulation means for controlling heat transfer out of at least a portion of said volume of memory material.

5. The memory element of claim 3, wherein said heating means includes one or more heating layers transferring heat energy into at least a portion of said volume of memory material by joule heating.

6. The memory element of claim 5, wherein at least one of said heating layers is deposited adjacent said volume of memory material.

7. The memory element of claim 5, wherein at least one of said heating layers has an electrical resistivity greater than about $1 \times 10^{-5}$ ohms-cm.

8. The memory element of claim 5, wherein at least one of said heating layers includes:
one or more elements selected from the group consisting of Ti, V, Cr, Zr, Nb, Mo, Hf, Ta, W and mixtures or alloys thereof; and
two or more elements selected from the group consisting of B, C, N, O, Al, Si, P, S and mixtures or alloys thereof.

9. The memory element of claim 8, wherein at least one of said heating layers includes Ti, Al, and N.

10. The memory element of claim 5, wherein at least one of said heating layers has a thickness between about 50 Å and 2000 Å.

11. The memory element of claim 4, wherein said thermal insulation means includes one or more thermal insulation layers at least partially encapsulating said volume of memory material, said one or more thermal insulation layers reducing heat transfer out of at least a portion of said volume of memory material.

12. The memory element of claim 11, wherein at least one of said thermal insulation layers has a specific heat less than about 3 joule per $cm^3$-Kelvin.

13. The memory element of claim 11, wherein at least one of said thermal insulation layers has a thermal conductivity less than about 0.2 joule-cm per $cm^2$-Kelvin-sec.

14. The memory element of claim 11, wherein at least one of said thermal insulation layers includes one or more materials selected from the group consisting of oxides, nitrides, oxynitrides, carbonitrides, fluorides, sulfides, chlorides, carbides, borides, phosphides, and mixtures or alloys thereof.

15. The memory element of claim 11, wherein at least one of said thermal insulation layers includes an organic dielectric material.

16. The memory element of claim 11, wherein at least one of said thermal insulation layers has a thickness between about 100 Å and 10,000 Å.

17. The memory element of claim 2, wherein said thermal control means includes a volume of thermal insulation material at least partially encapsulated within said volume of memory material.

18. The memory element of claim 1, wherein said energy control means includes electrical control means for controlling the distribution of current within at least a portion of said volume of memory material.

19. The memory element of claim 18, wherein said electrical control means includes one or more resistive layers spreading the distribution of current within at least a portion of said volume of memory material.

20. The memory element of claim 19, wherein at least one of said resistive layers has an electrical resistivity greater than about $1 \times 10^{-5}$ ohms-cm.

21. The memory element of claim 19, wherein at least one of said resistive layers includes:
one or more elements selected from the group consisting of Ti, V, Cr, Zr, Nb, Mo, Hf, Ta, W and mixtures or alloys thereof; and
two or more elements selected from the group consisting of B, C, N, O, Al, Si, P, S and mixtures or alloys thereof.

22. The memory element of claim 19, wherein at least one of said resistive layers has a thickness between about 50 Å and 2000 Å.

23. The memory element of claim 1, wherein at least one of said pair of spacedly disposed electrical contacts includes one or more elements selected from the group consisting of Ti, W, Mo, and mixtures or alloys thereof.

24. The memory element of claim 1, wherein at least one of said pair of spacedly disposed electrical contacts is an electrical contact layer having a thickness between about 50 Å and about 2000 Å.

25. The memory element of claim 1, wherein said volume of memory material includes one or more elements selected from the group consisting of Te, Se, Ge, Sb, Bi, Pb, Sn, As, S, Si, P, O, and mixtures or alloys thereof.

26. The memory element of claim 25, wherein said volume of memory material includes one or more chalcogen elements.

27. The memory element of claim 26, wherein said volume of memory material further includes one or more transition metal elements.

28. The memory element of claim 26, wherein said one or more chalcogen elements are selected from the group consisting of Te, Se, and mixtures or alloys thereof.

29. The memory element of claim 28, wherein said one or more chalcogen elements includes a mixture of Te and Se.

30. The memory element of claim 27, wherein said one or more transition metal elements are selected from the group consisting of Cr, Fe, Ni, Nb, Pd, Pt, and mixtures or alloys thereof.

31. An electrically operated memory array comprising:
a plurality of electrically activated, directly overwritable memory elements, each of said plurality of memory elements including:
a volume of memory material having two or more electrical resistance values, said volume of memory material being setable to one of said electrical resistance values in response to a selected electrical input signal without the need to be set to a specific starting or erased electrical resistance value;
a pair of spacedly disposed electrical contacts for supplying said electrical input signal; and
energy control means for controlling the energy environment of at least a portion of said volume of memory material.

32. The memory array of claim 31, wherein said energy control means includes thermal control means for controlling the thermal environment of at least a portion of said volume of memory material.

33. The memory array of claim 32, wherein said thermal control means includes heating means for transferring heat energy into at least a portion of said volume of memory material.

34. The memory array of claim 32, wherein said thermal control means includes thermal insulation means for controlling heat transfer out of at least a portion of said volume of memory material.

35. The memory array of claim 33, wherein said heating means includes one or more heating layers transferring heat energy into at least a portion of said volume of memory material by joule heating.

36. The memory array of claim 35, wherein at least one of said heating layers is deposited adjacent said volume of memory material.

37. The memory array of claim 35, wherein at least one of said heating layers has an electrical resistivity greater than about $1 \times 10^{-5}$ ohms-cm.

38. The memory array of claim 35, wherein at least one of said heating layers includes:
  one or more elements selected from the group consisting of Ti, V, Cr, Zr, Nb, Mo, Hf, Ta, W and mixtures or alloys thereof; and
  two or more elements selected from the group consisting of B, C, N, O, Al, Si, P, S and mixtures or alloys thereof.

39. The memory element of claim 38, wherein at least one of said heating layers includes Ti, Al, and N.

40. The memory array of claim 35, wherein at least one of said heating layers has a thickness between about 50 Å and 2000 Å.

41. The memory array of claim 34, wherein said thermal insulation means includes one or more thermal insulation layers at least partially encapsulating said volume of memory material, said one or more thermal insulation layers reducing heat transfer out of at least a portion of said volume of memory material.

42. The memory array of claim 41, wherein at least one of said thermal insulation layers has a specific heat less than about 3 joule per cm$^3$-Kelvin.

43. The memory array of claim 41, wherein at least one of said thermal insulation layers has a thermal conductivity less than about 0.2 joule-cm per cm$^2$-Kelvin-sec.

44. The memory array of claim 41, wherein at least one of said thermal insulation layers includes one or more materials selected from the group consisting of oxides, nitrides, oxynitrides, carbonitrides, fluorides, sulfides, chlorides, carbides, borides, phosphides, and mixtures or alloys thereof.

45. The memory array of claim 41, wherein at least one of said thermal insulation layers includes an organic dielectric material.

46. The memory array of claim 41, wherein at least one of said thermal insulation layers has a thickness between about 100 Å and 10,000 Å.

47. The memory array of claim 32, wherein said thermal control means includes a volume of thermal insulation material at least partially encapsulated within said volume of memory material.

48. The memory array of claim 32, wherein said thermal control means includes thermal isolating means for thermally isolating each of said plurality of memory elements from all other of said plurality of memory elements.

49. The memory array of claim 31, wherein said energy control means includes electrical control means for controlling the distribution of current within at least a portion of said volume of memory material.

50. The memory array of claim 49, wherein said electrical control means includes one or more resistive layers spreading the distribution of current within at least a portion of said volume of memory material.

51. The memory element of claim 50, wherein at least one of said resistive layers has an electrical resistivity greater than about $1 \times 10^{-5}$ ohms-cm.

52. The memory element of claim 50, wherein at least one of said resistive layers includes:
  one or more elements selected from the group consisting of Ti, V, Cr, Zr, Nb, Mo, Hf, Ta, W and mixtures or alloys thereof; and
  two or more elements selected from the group consisting of B, C, N, O, Al, Si, P, S and mixtures or alloys thereof.

53. The memory element of claim 50, wherein at least one of said resistive layers has a thickness between about 50 Å and 2000 Å.

54. The memory array of claim 31, wherein at least one of said pair of spacedly disposed electrical contacts includes one or more elements selected from the group consisting of Ti, W, Mo, and mixtures of alloys thereof.

55. The memory array of claim 31, wherein at least one of said pair of spacedly disposed electrical contacts is an electrical contact layer having a thickness between about 50 Å to about 2000 Å.

56. The memory array of claim 31, wherein said volume of memory material includes one or more elements selected from the group consisting of Te, Se, Ge, Sb, Bi, Pb, Sn, As, S, Si, P, O, and mixtures or alloys thereof.

57. The memory array of claim 56, wherein said volume of memory material includes one or more chalcogen elements.

58. The memory array of claim 57, wherein said volume of memory material further includes one or more transition metal elements.

59. The memory array of claim 57, wherein said one or more chalcogen elements are selected from the group consisting of Te, Se, and mixtures or alloys thereof.

60. The memory array of claim 59, wherein said one or more chalcogen elements includes a mixture of Te and Se.

61. The memory array of claim 58, wherein said one or more transition metal elements are selected from the group consisting of Cr, Fe, Ni, Nb, Pd, Pt, and mixtures or alloys thereof.

62. The memory array of claim 31, wherein each of said plurality of memory elements further includes an electrical isolation device electrically isolating each of said plurality of memory elements from all other of said plurality of memory elements.

63. A method of programming an electrically operated memory element, said method comprising:
  providing a memory element, said memory element including:
    a volume of memory material having two or more electrical resistance values, said volume of memory material being setable to one of said electrical resistance values in response to a selected electrical input signal; and
    a pair of spacedly disposed electrical contacts for supplying said electrical input signal;
  applying an electrical input signal to said contacts; and
  controlling the electrical input signal and the energy environment of said volume of memory material such that the viscosity of said material is reduced to below about $10^{14}$ Poise.

64. The method of claim 63, wherein said step of controlling the energy environment of said volume of memory material includes providing said volume of memory material with a means for controlling heat loss from at least a portion thereof, thereby preventing loss of electrical input by means of loss of heat energy to the surrounding environment.

65. The method of claim 64, wherein said means for controlling heat loss includes at least one thermal insulation layer at least partially encapsulating said volume of memory material.

* * * * *